United States Patent
Jo et al.

(10) Patent No.: US 12,543,600 B2
(45) Date of Patent: Feb. 3, 2026

(54) MEMORY DEVICE

(71) Applicant: Samsung Electronics Co., Ltd., Suwon-si (KR)

(72) Inventors: Chajea Jo, Yongin-si (KR); Inhyo Hwang, Asan-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 574 days.

(21) Appl. No.: 18/048,606

(22) Filed: Oct. 21, 2022

(65) Prior Publication Data

US 2023/0163090 A1 May 25, 2023

(30) Foreign Application Priority Data

Nov. 23, 2021 (KR) .................. 10-2021-0162600

(51) Int. Cl.
*H01L 25/065* (2023.01)
*H01L 23/00* (2006.01)
*H01L 25/18* (2023.01)

(52) U.S. Cl.
CPC .......... *H01L 24/08* (2013.01); *H01L 25/0657* (2013.01); *H01L 25/18* (2013.01); *H01L 2224/08145* (2013.01); *H01L 2924/1431* (2013.01); *H01L 2924/14511* (2013.01)

(58) Field of Classification Search
CPC ................. H01L 24/08; H01L 25/0657; H01L 2224/08145; H01L 2924/1431; H01L 2924/14511; H10B 43/27; H10B 43/40; H10B 43/50; H10B 43/35
See application file for complete search history.

(56) References Cited

U.S. PATENT DOCUMENTS

| | | |
|---|---|---|
| 6,958,945 B2 | 10/2005 | Shore |
| 9,230,987 B2 | 1/2016 | Pachamuthu et al. |
| 10,283,493 B1 | 5/2019 | Nishida |
| 10,373,653 B2 | 8/2019 | Lee et al. |
| 10,600,781 B1 | 3/2020 | Xiao et al. |
| 10,811,071 B1 | 10/2020 | Li et al. |
| 10,811,402 B2 | 10/2020 | Chen et al. |
| 10,886,299 B2 | 1/2021 | Hwang et al. |
| 11,450,653 B2* | 9/2022 | Huang .................. H01L 23/481 |
| 2018/0277497 A1* | 9/2018 | Matsuo .................. H10D 88/00 |
| 2019/0043868 A1 | 2/2019 | Hasnat et al. |
| 2020/0105721 A1* | 4/2020 | Park ...................... H01L 23/528 |
| 2020/0105735 A1* | 4/2020 | Park ...................... H01L 23/528 |

(Continued)

FOREIGN PATENT DOCUMENTS

| | | |
|---|---|---|
| KR | 20180136034 A | 12/2018 |
| KR | 20210000753 A | 1/2021 |
| KR | 20210118933 A | 10/2021 |

*Primary Examiner* — Thanh Y. Tran
(74) *Attorney, Agent, or Firm* — Wolf, Greenfield & Sacks, P.C.

(57) ABSTRACT

A memory device is provided. The memory device includes a first structure and a second structure stacked on the first structure in a vertical direction. The first structure includes a first substrate, peripheral circuitry, an auxiliary memory cell array, a first insulating layer, and a plurality of first bonding pads. The second structure includes a second substrate, a main memory cell array, a second insulating layer, and a plurality of second bonding pads. The plurality of first bonding pads are in contact with the plurality of second bonding pads, respectively.

20 Claims, 8 Drawing Sheets

(56) References Cited

U.S. PATENT DOCUMENTS

| | | | |
|---|---|---|---|
| 2020/0144242 A1* | 5/2020 | Park | ......................... H01L 24/83 |
| 2021/0057028 A1 | 2/2021 | Hosomura | |
| 2021/0104543 A1 | 4/2021 | Xiao | |
| 2021/0210142 A1 | 7/2021 | Liu | |
| 2022/0216227 A1* | 7/2022 | Rha | ......................... H10B 41/27 |
| 2022/0246213 A1* | 8/2022 | Takekida | ............... G11C 16/10 |
| 2023/0215826 A1* | 7/2023 | Kim | ......................... H01L 25/18 |

* cited by examiner

MEMORY DEVICE

CROSS-REFERENCE TO RELATED APPLICATION

This application is based on and claims priority under 35 U.S.C. § 119 to Korean Patent Application No. 10-2021-0162600, filed on Nov. 23, 2021, in the Korean Intellectual Property Office, the disclosure of which is incorporated by reference herein in its entirety.

FIELD

The inventive concept relates to a memory device. More particularly, the inventive concept relates to a three-dimensional memory device.

BACKGROUND

An electronic system requiring data storage may need a memory device capable of storing high-capacity data. Accordingly, methods capable of increasing data storage capacity of a memory device have been researched. For example, as one method of increasing data storage capacity of a memory device, a three-dimensional memory device having three-dimensionally arranged memory cells instead of two-dimensionally arranged memory cells has been proposed.

SUMMARY

The inventive concept provides a memory device having an increased storage capacity or yield.

According to an aspect of the inventive concept, there is provided a memory device including: a first structure and a second structure stacked on the first structure in a vertical direction, wherein the first structure includes: a first substrate; peripheral circuitry on the first substrate; an auxiliary memory cell array on the first substrate; a first insulating layer on the first substrate, the peripheral circuitry, and the auxiliary memory cell array; and a plurality of first bonding pads on the first insulating layer and electrically connected to the peripheral circuitry. The second structure includes: a second substrate; a main memory cell array on the second substrate; a second insulating layer on the second substrate and the main memory cell array; and a plurality of second bonding pads on the second insulating layer and electrically connected to the main memory cell array, wherein the plurality of first bonding pads are in contact with the plurality of second bonding pads, respectively.

According to another aspect of the inventive concept, there is provided a memory device including: a first structure and a second structure stacked on the first structure in a vertical direction, wherein the first structure includes: a first substrate; peripheral circuitry on the first substrate; at least one auxiliary memory cell array on the first substrate; a first insulating layer on the first substrate, the peripheral circuitry, and the at least one auxiliary memory cell array; and a plurality of first bonding pads on the first insulating layer and electrically connected to the peripheral circuitry. The second structure includes: a second substrate; a plurality of main memory cell arrays on the second substrate; a second insulating layer on the second substrate and the plurality of main memory cell arrays; and a plurality of second bonding pads on the second insulating layer and electrically connected to the plurality of main memory cell arrays, wherein the plurality of first bonding pads are in contact with the plurality of second bonding pads, respectively, and a number of the at least one auxiliary memory cell array is fewer than a number of the main memory cell arrays.

According to another aspect of the inventive concept, there is provided a memory device including: a first structure and a second structure stacked on the first structure in a vertical direction, wherein the first structure includes: a first substrate; peripheral circuitry on the first substrate; a first insulating layer on the first substrate and the peripheral circuitry; a second substrate on the first insulating layer; an auxiliary memory cell array on the second substrate; a second insulating layer on the second substrate and the auxiliary memory cell array; and a plurality of first bonding pads on the second insulating layer and electrically connected to the peripheral circuitry. The second structure includes: a third substrate; a main memory cell array on the third substrate; a third insulating layer on the third substrate and the main memory cell array; and a plurality of second bonding pads on the third insulating layer and electrically connected to the main memory cell array, wherein the plurality of first bonding pads are in contact with the plurality of second bonding pads, respectively.

BRIEF DESCRIPTION OF THE DRAWINGS

Embodiments of the inventive concept will be more clearly understood from the following detailed description taken in conjunction with the accompanying drawings in which.

DETAILED DESCRIPTION OF EMBODIMENTS

Figure 1:
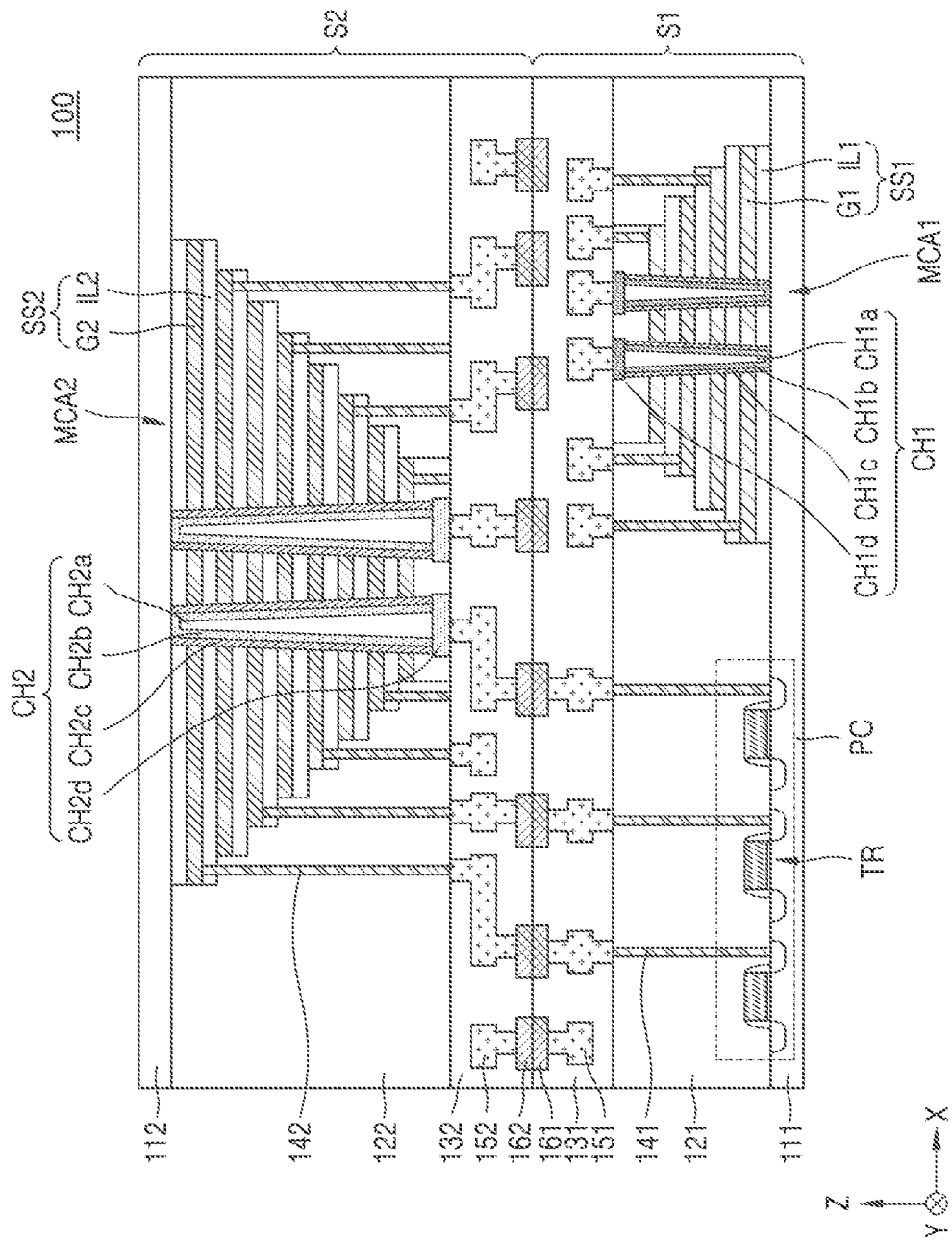
FIG. 1 is a cross-sectional view illustrating a memory device according to an embodiment of the inventive concept.

FIG. 1 is a cross-sectional view illustrating a memory device 100 according to an embodiment of the inventive concept.

Referring to FIG. 1, the memory device 100 may include a first structure S1 and a second structure S2 stacked on the first structure S1 in a vertical direction (e.g., in the Z-direction). That is, an upper surface of the first structure S1 may be in contact with a lower surface of the second structure S2. Elements or structures that are described as "in contact" or "in contact with" other elements or structures may refer to direct physical contact, with no intervening elements or structures therebetween. The terms first, second, etc., may be used herein merely to distinguish one element or layer from another.

The first structure S1 may include a first substrate 111, peripheral circuitry (also referred to herein as a peripheral circuit(s)) PC, an auxiliary memory cell array MCA1, a first insulating layer 121, and a plurality of first bonding pads 161. The first structure S1 may further include a second insulating layer 131, a first interconnect structure 151, and a plurality of first contacts 141.

The first substrate 111 may include a semiconductor material such as a group IV semiconductor material, a group III-V semiconductor material, or a group II-VI semiconductor material. The group IV semiconductor material may include, for example, silicon (Si), germanium (Ge), or SiGe. The group III-V semiconductor material may include, for example, gallium arsenide (GaAs), indium phosphide (InP), gallium phosphide (GaP), indium arsenide (InAs), indium antimonide (InSb), or indium gallium arsenide (InGaAs). The group II-VI semiconductor material may include, for example, zinc telluride (ZnTe) or cadmium Sulfide (CdS).

The peripheral circuit PC may be on the first substrate 111. The peripheral circuit PC may include a plurality of transistors. The peripheral circuit PC may include, for example, a row decoder, a page buffer, a data input/output circuit, and a control logic. The peripheral circuit PC may further include various circuits such as a voltage generation circuit and an error correction circuit.

The auxiliary memory cell array MCA1 may be on the first substrate 111, for example, laterally adjacent the peripheral circuit PC. The auxiliary memory cell array MCA1 may be a three-dimensional memory cell array. The auxiliary memory cell array MCA1 may include a first stack structure SS1 and a plurality of first channel structures CH1 on the first substrate 111. Although FIG. 1 shows that the auxiliary memory cell array MCA1 includes two first channel structures CH1, the number of first channel structures CH1 included in the auxiliary memory cell array MCA1 is not limited thereto.

The first stack structure SS1 may include parts having a staircase shape. The first stack structure S S1 may include a plurality of first interlayer insulating layers IL1 and a plurality of first gate layers G1 alternately stacked with each other on the first substrate 111. That is, the first gate layers G1 may be separated from each other by the first interlayer insulating layers IL1. Although FIG. 1 shows that the first stack structure SS1 includes four first gate layers G1 and five first interlayer insulating layers ILL the numbers of first gate layers G1 and first interlayer insulating layers IL1 included in the first stack structure SS1 are not limited thereto.

The first interlayer insulating layer IL1 may include a silicon oxide ($SiO_2$), a silicon nitride (SiN), or a combination thereof. The first gate layer G1 may include a conductive material such as tungsten (W), nickel (Ni), cobalt (Co), tantalum (Ta), a tungsten nitride (WN), a titanium nitride (TiN), a tantalum nitride (TaN), or a combination thereof.

Each first channel structure CH1 may pass through the first stack structure SS1 in the vertical direction (Z direction). Each first channel structure CH1 may include a first channel layer CH1$b$, a first buried insulating layer CH1$a$, a first pad CH1$d$, and a first gate dielectric layer CH1$c$.

The first channel layer CH1$b$ may be in contact with the first substrate 111 and pass through the first stack structure SS1 in the vertical direction (Z direction). The first channel layer CH1$b$ may have a hollow cylindrical shape. The first channel layer CH1$b$ may include polysilicon or polygermanium.

A space surrounded by the first channel layer CH1$b$ may be filled with the first buried insulating layer CH1$a$. The first buried insulating layer CH1$a$ may include, for example, an insulating material such as $SiO_2$, SiN, or a combination thereof. In some embodiments, the first buried insulating layer CH1$a$ may be omitted. In this case, the first channel layer CH1$b$ may have a pillar shape.

The first pad CH1$d$ may be on the first buried insulating layer CH1$a$ and in contact with the first channel layer CH1$b$. The first pad CH1$d$ may include polysilicon, a metal, a metal nitride, or a combination thereof. The metal may include, for example, W, Ni, Co, Ta, or the like.

The first gate dielectric layer CH1$c$ may extend between the first channel layer CH1$b$ and the first stack structure SS1. The first gate dielectric layer CH1$c$ may include a tunneling dielectric layer, a charge storage layer, and a blocking dielectric layer sequentially stacked on the first channel layer CH1$b$. The tunneling dielectric layer may include $SiO_2$, a hafnium oxide ($HfO_2$), an aluminum oxide ($Al_2O_3$), a zirconium oxide ($ZrO_2$), a tantalum oxide ($Ta_2O_5$), or a combination thereof. The charge storage layer may include SiN, a boron nitride (BN), or polysilicon. The blocking dielectric layer may include $SiO_2$, SiN, $HfO_2$, $Al_2O_3$, $ZrO_2$, $Ta_2O_5$, or a combination thereof.

The first insulating layer 121 may cover the first substrate 111, the peripheral circuit PC, and a side surface of the auxiliary memory cell array MCA1. The first insulating layer 121 may include $SiO_2$, SiN, a low-k material, or a combination thereof. The low-k material may include, for example, fluorinated tetraethylorthosilicate (FTEOS), hydrogen silsesquioxane (HSQ), bis-benzocyclobutene (BCB), tetramethylorthosilicate (TMOS), octamethyleyclotetrasiloxane (OMCTS), hexamethyldisiloxane (HMDS), trimethylsilyl borate (TMSB), diacetoxyditertiarybutosiloxane (DADBS), trimethylsilil phosphate (TMSP), polytetrafluoroethylene (PTFE), tonen silazen (TOSZ), fluoride silicate glass (FSG), polypropylene oxide, carbon doped silicon oxide (CDO), organo silicate glass (OSG), silicon low-k (SiLK), amorphous fluorinated carbon, silica aerogel, silica xerogel, mesoporous silica, or a combination thereof.

The second insulating layer 131 may be on the first insulating layer 121 and cover an upper surface of the auxiliary memory cell array MCA1. The second insulating layer 131 may include $SiO_2$, SiN, a low-k material, or a combination thereof. The first insulating layer 121 and the second insulating layer 131 of FIG. 1 may be collectively referred to as a first insulating layer.

The plurality of first bonding pads 161 may be on the second insulating layer 131. The plurality of first bonding pads 161 may include copper (Cu), Ni, W, aluminum (Al), gold (Au), titanium (Ti), TiN, or a combination thereof.

The first interconnect structure 151 may electrically connect the plurality of first bonding pads 161 to the peripheral circuit PC and electrically connect the peripheral circuit PC to the auxiliary memory cell array MCA1. The first interconnect structure 151 may include a plurality of conductive lines and a plurality of conductive vias. The plurality of conductive lines and the plurality of conductive vias may include, for example, Cu, W, Al, Au, silver (Ag), Ni, Ta, Ti, TaN, TiN, or a combination thereof.

The plurality of first contacts 141 may electrically connect the peripheral circuit PC and the auxiliary memory cell array MCA1 to the first interconnect structure 151. The plurality of first contacts 141 may be surrounded by the first insulating layer 121. The plurality of first contacts 141 may include, for example, Cu, W, Al, Au, Ag, Ni, Ta, Ti, TaN, TiN, or a combination thereof.

The second structure S2 may include a second substrate 112, a main memory cell array MCA2, a third insulating layer 122, and a plurality of second bonding pads 162. The second structure S2 may further include a fourth insulating layer 132, a second interconnect structure 152, and a plurality of second contacts 142.

The second substrate 112 may include a semiconductor material such as a group IV semiconductor material, a group III-V semiconductor material, or a group II-VI semiconductor material. The group IV semiconductor material may include, for example, S1, Ge, or SiGe. The group III-V semiconductor material may include, for example, GaAs, InP, GaP, InAs, InSb, or InGaAs. The group II-VI semiconductor material may include, for example, ZnTe or CdS.

The main memory cell array MCA2 may be on the second substrate 112. The main memory cell array MCA2 may be a three-dimensional memory cell array. The main memory cell array MCA2 may include a second stack structure SS2 and a plurality of second channel structures CH2 on the second substrate 112. Although FIG. 1 shows that the main memory cell array MCA2 includes two second channel structures CH2, the number of second channel structures CH2 included in the main memory cell array MCA2 is not limited thereto.

The second stack structure SS2 may include parts having a staircase shape. The second stack structure SS2 may include a plurality of second interlayer insulating layers IL2 and a plurality of second gate layers G2 alternately stacked with each other on the second substrate 112. That is, the second gate layers G2 may be separated from each other by the second interlayer insulating layers IL2. Although FIG. 1 shows that the second stack structure SS2 includes eight second gate layers G2 and nine second interlayer insulating layers IL2, the numbers of second gate layers G2 and second interlayer insulating layers IL2 included in the second stack structure SS2 are not limited thereto.

The second interlayer insulating layer IL2 may include $SiO_2$, SiN, or a combination thereof. The second gate layer G2 may include a conductive material such as W, Ni, Co, Ta, WN, TiN, TaN, or a combination thereof.

Each second channel structure CH2 may pass through the second stack structure SS2 in the vertical direction (Z direction). Each second channel structure CH2 may include a second channel layer CH2$b$, a second buried insulating layer CH2$a$, a second pad CH2$d$, and a second gate dielectric layer CH2$c$.

The second channel layer CH2$b$ may be in contact with the second substrate 112 and pass through the second stack structure SS2 in the vertical direction (Z direction). The second channel layer CH2$b$ may have a hollow cylindrical shape. The second channel layer CH2$b$ may include polysilicon or polygermanium.

A space surrounded by the second channel layer CH2$b$ may be filled with the second buried insulating layer CH2$a$. The second buried insulating layer CH2$a$ may include, for example, an insulating material such as $SiO_2$, SiN, or a combination thereof. In some embodiments, the second buried insulating layer CH2$a$ may be omitted. In this case, the second channel layer CH2$b$ may have a pillar shape.

The second pad CH2$d$ may be on the second buried insulating layer CH2$a$ and in contact with the second channel layer CH2$b$. The second pad CH2$d$ may include polysilicon, a metal, a metal nitride, or a combination thereof. The metal may include, for example, W, Ni, Co, Ta, or the like.

The second gate dielectric layer CH2$c$ may extend between the second channel layer CH2$b$ and the second stack structure SS2. The second gate dielectric layer CH2$c$ may include a tunneling dielectric layer, a charge storage layer, and a blocking dielectric layer sequentially stacked on the second channel layer CH2$b$. The tunneling dielectric layer may include $SiO_2$, $HfO_2$, $Al_2O_3$, $ZrO_2$, $Ta_2O_5$, or a combination thereof. The charge storage layer may include SiN, BN, or polysilicon. The blocking dielectric layer may include $SiO_2$, SiN, $HfO_2$, $Al_2O_3$, $ZrO_2$, $Ta_2O_5$, or a combination thereof.

A volume of the auxiliary memory cell array MCA1 may be less than a volume of the main memory cell array MCA2. For example, the auxiliary memory cell array MCA1 may be physically smaller than the main memory cell array MCA2 in one or more dimensions (e.g., along the X, Y, and/or Z directions). In some embodiments, a planar area of the auxiliary memory cell array MCA1 (e.g., along a plane that is perpendicular to the vertical direction (Z direction)) may be less than a planar area of the main memory cell array MCA2 perpendicular to the vertical direction (Z direction). In some embodiments, the number of memory cells in the auxiliary memory cell array MCA1 may be fewer than the number of memory cells in the main memory cell array MCA2. A memory cell in the auxiliary memory cell array MCA1 may be defined by the first gate layer G1 and the first channel structure CH1. A memory cell in the main memory cell array MCA2 may be defined by the second gate layer G2 and the second channel structure CH2. In some embodiments, the number of first gate layers G1 may be fewer than the number of second gate layers G2.

The third insulating layer 122 may cover a lower surface of the second substrate 112 and a side surface of the main memory cell array MCA2. The third insulating layer 122 may include $SiO_2$, SiN, a low-k material, or a combination thereof.

The fourth insulating layer 132 may be on the third insulating layer 122 and cover a lower surface of the main memory cell array MCA2. The fourth insulating layer 132 may include $SiO_2$, SiN, a low-k material, or a combination thereof. The third insulating layer 122 and the fourth insulating layer 132 of FIG. 1 may be collectively referred to as a second insulating layer.

The plurality of second bonding pads 162 may be on the fourth insulating layer 132. The plurality of second bonding pads 162 may include Cu, Ni, W, Al, Au, Ti, TiN, or a combination thereof. The plurality of first bonding pads 161 may be in contact with the plurality of second bonding pads 162, respectively. By bonding the plurality of first bonding pads 161 with the plurality of second bonding pads 162, the first structure S1 and the second structure S2 may be electrically and mechanically connected to each other.

The second interconnect structure 152 may electrically connect the plurality of second bonding pads 162 to the main memory cell array MCA2. The second interconnect structure 152 may include a plurality of conductive lines and a plurality of conductive vias. The plurality of conductive lines and the plurality of conductive vias may include, for example, Cu, W, Al, Au, Ag, Ni, Ta, Ti, TaN, TiN, or a combination thereof.

The plurality of second contacts 142 may electrically connect the main memory cell array MCA2 to the second interconnect structure 152. The plurality of second contacts 142 may be surrounded by the third insulating layer 122. The plurality of second contacts 142 may include, for example, Cu, W, Al, Au, Ag, Ni, Ta, Ti, TaN, TiN, or a combination thereof.

In some embodiments, the auxiliary memory cell array MCA1 may provide an additional storage capacity in addition to a storage capacity of the main memory cell array MCA2. Therefore, the memory device 100 may have an increased storage capacity provided by the collective storage capacity of the main memory cell array MCA2 in combination with the auxiliary memory cell array MCA1. In some embodiments, the auxiliary memory cell array MCA1 may be used to repair the main memory cell array MCA2, for example, by using one or more of the auxiliary memory cells to replace one or more of the main memory cells. Therefore, a yield of the memory device 100 may be improved.

Figure 2:
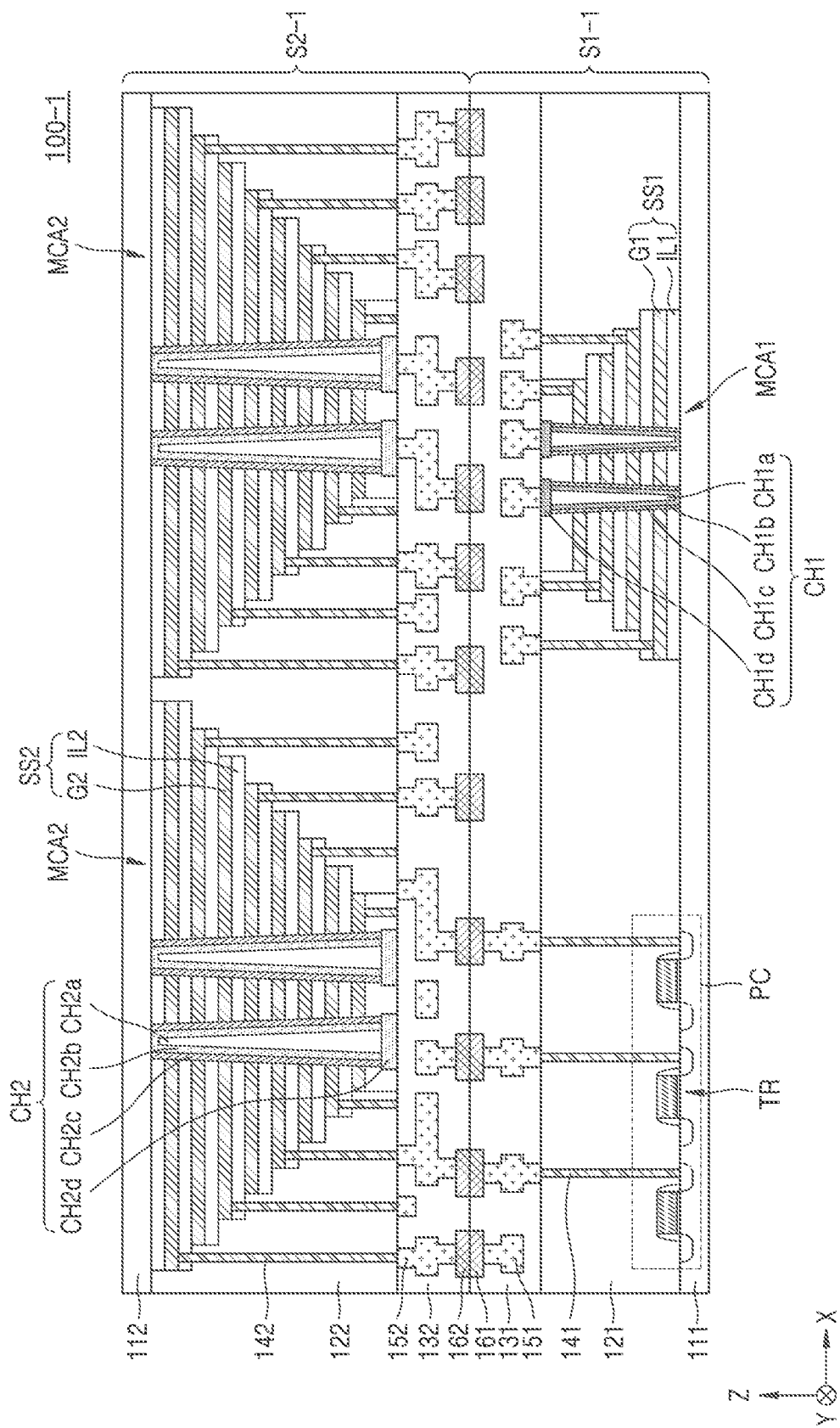
FIG. 2 is a cross-sectional view illustrating a memory device according to an embodiment of the inventive concept.

FIG. 2 is a cross-sectional view illustrating a memory device 100-1 according to an embodiment of the inventive concept. Hereinafter, differences between the memory device 100 shown in FIG. 1 and the memory device 100-1 shown in FIG. 2 are described.

Referring to FIG. 2, the memory device 100-1 may include a first structure S1-1 and a second structure S2-1. The first structure S1-1 may include the first substrate 111, the peripheral circuit PC, at least one auxiliary memory cell array MCA1, the first insulating layer 121, and the plurality of first bonding pads 161. The first structure S1-1 may further include the second insulating layer 131, the first interconnect structure 151, and the plurality of first contacts 141.

The second structure S2-1 may include the second substrate 112, a plurality of main memory cell arrays MCA2, the third insulating layer 122, and the plurality of second bonding pads 162. The second structure S2-1 may further include the fourth insulating layer 132, the second interconnect structure 152, and the plurality of second contacts 142.

The number of auxiliary memory cell arrays MCA1 may be fewer than the number of main memory cell arrays MCA2. Although FIG. 2 shows that the first structure S1-1 includes one auxiliary memory cell array MCA1 and the second structure S2-1 includes two main memory cell arrays MCA2, the number of auxiliary memory cell arrays MCA1 included in the first structure S1-1 and the number of main memory cell arrays MCA2 included in the second structure S2-1 are not limited thereto.

Figure 3:
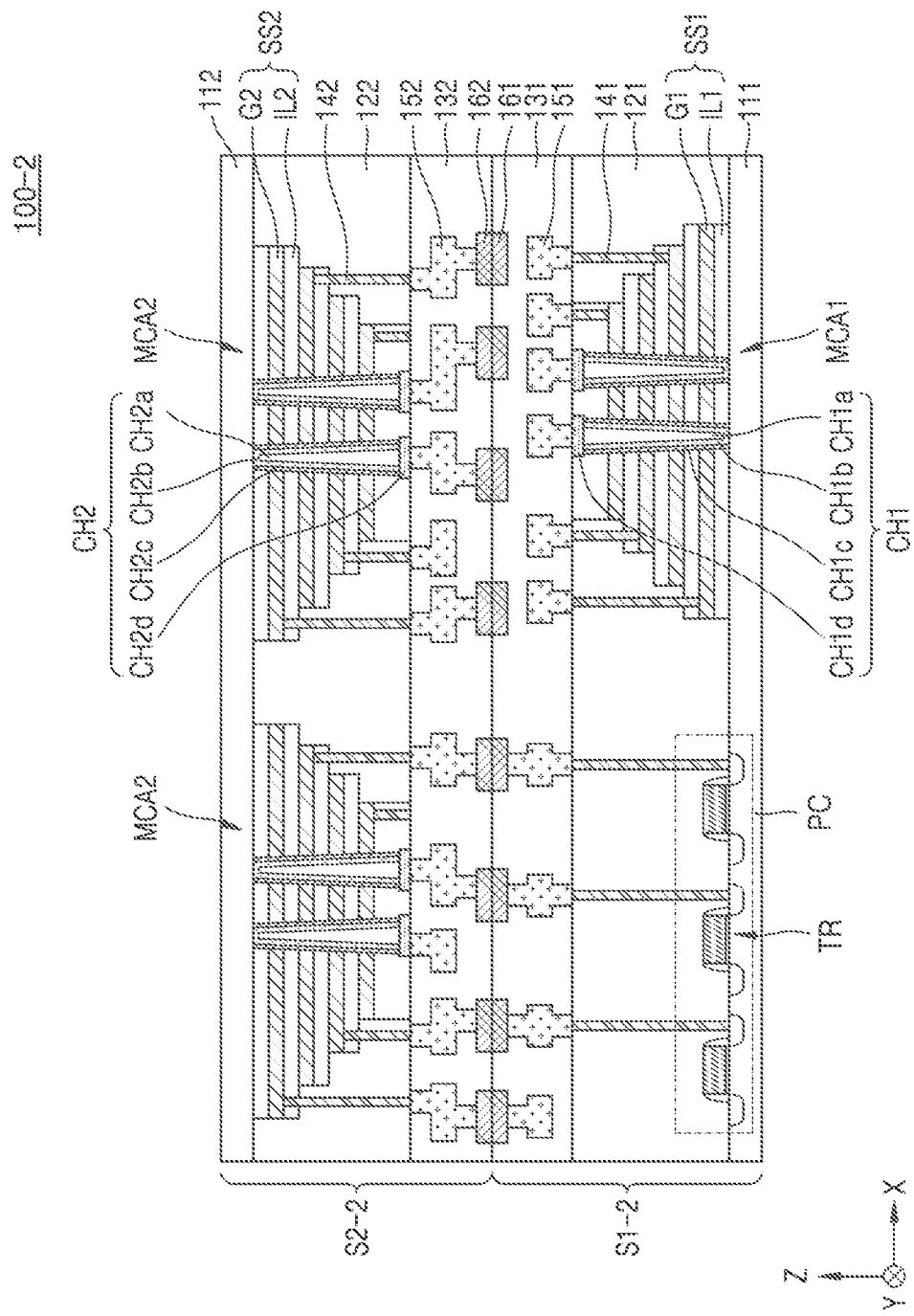
FIG. 3 is a cross-sectional view illustrating a memory device according to an embodiment of the inventive concept.

FIG. 3 is a cross-sectional view illustrating a memory device 100-2 according to an embodiment of the inventive concept. Hereinafter, differences between the memory device 100 shown in FIG. 1 and the memory device 100-2 shown in FIG. 3 are described.

Referring to FIG. 3, the memory device 100-2 may include a first structure S1-2 and a second structure S2-2. The first structure S1-2 may include the first substrate 111, the peripheral circuit PC, at least one auxiliary memory cell array MCA1, the first insulating layer 121, and the plurality of first bonding pads 161. The first structure S1-2 may further include the second insulating layer 131, the first interconnect structure 151, and the plurality of first contacts 141.

The second structure S2-2 may include the second substrate 112, a plurality of main memory cell arrays MCA2, the third insulating layer 122, and the plurality of second bonding pads 162. The second structure S2-2 may further include the fourth insulating layer 132, the second interconnect structure 152, and the plurality of second contacts 142.

The number of auxiliary memory cell arrays MCA1 may be fewer than the number of main memory cell arrays MCA2. Although FIG. 3 shows that the first structure S1-2 includes one auxiliary memory cell array MCA1 and the second structure S2-2 includes two main memory cell arrays MCA2, the number of auxiliary memory cell arrays MCA1 included in the first structure S1-2 and the number of main memory cell arrays MCA2 included in the second structure S2-2 are not limited thereto.

In some embodiments, a planar area of each auxiliary memory cell array MCA1 perpendicular to the vertical direction (Z direction) may be equal to a planar area of each main memory cell array MCA2 perpendicular to the vertical direction (Z direction). In some embodiments, a volume of each auxiliary memory cell array MCA1 may be equal to a volume of each main memory cell array MCA2. In some embodiments, the number of memory cells in each auxiliary memory cell array MCA1 may be equal to the number of memory cells in each main memory cell array MCA2. In some embodiments, the number of first gate layers G1 in each auxiliary memory cell array MCA1 may be equal to the number of second gate layers G2 in each main memory cell array MCA2.

Figure 4:
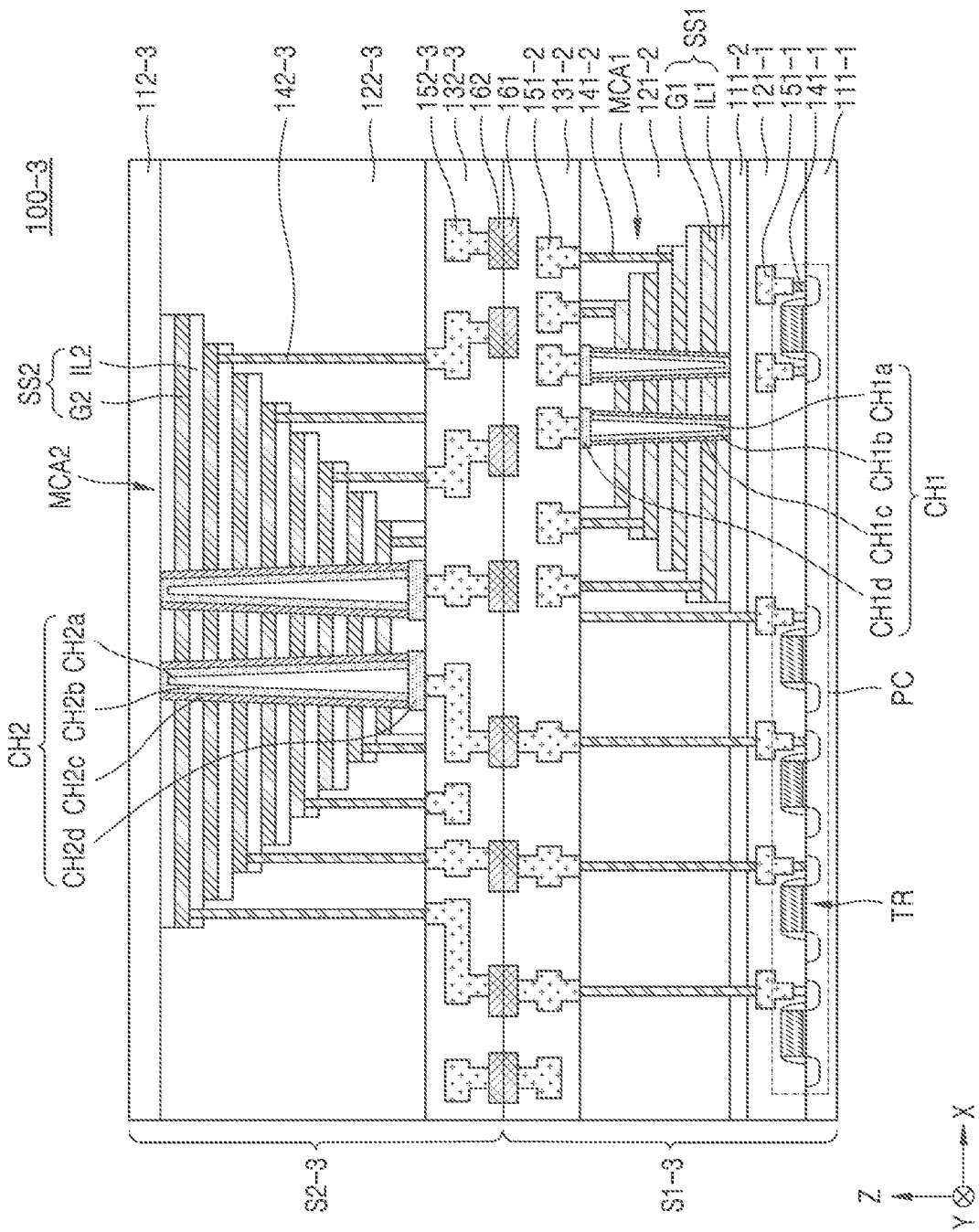
FIG. 4 is a cross-sectional view illustrating a memory device according to an embodiment of the inventive concept.

FIG. 4 is a cross-sectional view illustrating a memory device 100-3 according to an embodiment of the inventive concept. Hereinafter, differences between the memory device 100 shown in FIG. 1 and the memory device 100-3 shown in FIG. 4 are described.

Referring to FIG. 4, the memory device 100-3 may include a first structure S1-3 and a second structure S2-3.

The first structure S1-3 may include a first substrate 111-1, the peripheral circuit PC, a first insulating layer 121-1, a second substrate 111-2, the auxiliary memory cell array MCA1, a second insulating layer 121-2, and the plurality of first bonding pads 161. The first structure S1-3 may further include a plurality of first contacts 141-1, a first interconnect structure 151-1, a third insulating layer 131-2, a second interconnect structure 151-2, and a plurality of second contacts 141-2.

The first substrate 111-1 may include a semiconductor material such as a group IV semiconductor material, a group III-V semiconductor material, or a group II-VI semiconductor material. The group IV semiconductor material may include, for example, Si, Ge, or SiGe. The group III-V semiconductor material may include, for example, GaAs, InP, GaP, InAs, InSb, or InGaAs. The group II-VI semiconductor material may include, for example, ZnTe or CdS. The peripheral circuit PC may be on the first substrate 111-1.

The first insulating layer 121-1 may cover the first substrate 111-1 and the peripheral circuit PC. The first insulating layer 121-1 may include SiO$_2$, SiN, a low-k material, or a combination thereof.

The first interconnect structure 151-1 may be inside the first insulating layer 121-1. The first interconnect structure 151-1 may include a plurality of conductive lines and a plurality of conductive vias. The plurality of conductive lines and the plurality of conductive vias may include, for example, Cu, W, Al, Au, Ag, Ni, Ta, Ti, TaN, TiN, or a combination thereof.

The plurality of first contacts 141-1 may connect the first interconnect structure 151-1 to the peripheral circuit PC. The plurality of first contacts 141-1 may be surrounded by the first insulating layer 121-1. The plurality of first contacts 141-1 may include, for example, Cu, W, Al, Au, Ag, Ni, Ta, Ti, TaN, TiN, or a combination thereof.

The second substrate 111-2 may be on the first insulating layer 121-1, for example, opposite to and stacked on the first substrate 111-1 in the vertical direction (Z-direction). The second substrate 111-2 may include a semiconductor material such as a group IV semiconductor material, a group III-V semiconductor material, or a group II-VI semiconductor material. The group IV semiconductor material may include, for example, S1, Ge, or SiGe. The group III-V semiconductor material may include, for example, GaAs, InP, GaP, InAs, InSb, or InGaAs. The group II-VI semiconductor material may include, for example, ZnTe or CdS. The auxiliary memory cell array MCA1 may be on the second substrate 111-2, for example, stacked on the peripheral circuit PC in the vertical direction (Z direction).

The second insulating layer 121-2 may cover an upper surface of the second substrate 111-2 and a side surface of the auxiliary memory cell array MCA1. The second insulating layer 121-2 may include $SiO_2$, SiN, a low-k material, or a combination thereof.

The third insulating layer 131-2 may be on the second insulating layer 121-2 and cover a lower surface of the auxiliary memory cell array MCA1. The third insulating layer 131-2 may include $SiO_2$, SiN, a low-k material, or a combination thereof. The second insulating layer 121-2 and the third insulating layer 131-2 of FIG. 4 may be collectively referred to as a second insulating layer.

The second interconnect structure 151-2 may electrically connect the plurality of first bonding pads 161 to the peripheral circuit PC and electrically connect the peripheral circuit PC to the auxiliary memory cell array MCA1. The second interconnect structure 151-2 may include a plurality of conductive lines and a plurality of conductive vias. The plurality of conductive lines and the plurality of conductive vias may include, for example, Cu, W, Al, Au, Ag, Ni, Ta, Ti, TaN, TiN, or a combination thereof.

The plurality of second contacts 141-2 may electrically connect the first interconnect structure 151-1 and the auxiliary memory cell array MCA1 to the second interconnect structure 151-2. The plurality of second contacts 141-2 may be surrounded by the second insulating layer 121-2. The plurality of second contacts 141-2 may include, for example, Cu, W, Al, Au, Ag, Ni, Ta, Ti, TaN, TiN, or a combination thereof.

The plurality of first bonding pads 161 may be on the third insulating layer 131-2. The plurality of first bonding pads 161 may include Cu, Ni, W, Al, Au, Ti, TiN, or a combination thereof.

The second structure S2-3 may include a third substrate 112-3, the main memory cell array MCA2, a fourth insulating layer 122-3, and the plurality of second bonding pads 162. The second structure S2-3 may further include a fifth insulating layer 132-3, a third interconnect structure 152-3, and a plurality of third contacts 142-3.

The third substrate 112-3 may include a semiconductor material such as a group IV semiconductor material, a group III-V semiconductor material, or a group II-VI semiconductor material. The group IV semiconductor material may include, for example, S1, Ge, or SiGe. The group III-V semiconductor material may include, for example, GaAs, InP, GaP, InAs, InSb, or InGaAs. The group II-VI semiconductor material may include, for example, ZnTe or CdS. The main memory cell array MCA2 may be on the third substrate 112-3.

The fourth insulating layer 122-3 may cover a lower surface of the third substrate 112-3 and the side surface of the main memory cell array MCA2. The fourth insulating layer 122-3 may include $SiO_2$, SiN, a low-k material, or a combination thereof.

The fifth insulating layer 132-3 may be on the fourth insulating layer 122-3. The fifth insulating layer 132-3 may cover the lower surface of the main memory cell array MCA2. The fifth insulating layer 132-3 may include $SiO_2$, SiN, a low-k material, or a combination thereof. The fourth insulating layer 122-3 and the fifth insulating layer 132-3 of FIG. 4 may be collectively referred to as a third insulating layer.

The third interconnect structure 152-3 may electrically connect the main memory cell array MCA2 to the plurality of second bonding pads 162. The third interconnect structure 151-3 may include a plurality of conductive lines and a plurality of conductive vias. The plurality of conductive lines and the plurality of conductive vias may include, for example, Cu, W, Al, Au, Ag, Ni, Ta, Ti, TaN, TiN, or a combination thereof.

The plurality of third contacts 142-3 may electrically connect the third interconnect structure 152-3 to the main memory cell array MCA2. The plurality of third contacts 142-3 may be surrounded by the fourth insulating layer 122-3.

The plurality of second bonding pads 162 may be on the fifth insulating layer 132-3. The plurality of second bonding pads 162 may include Cu, Ni, W, Al, Au, Ti, TiN, or a combination thereof. The plurality of first bonding pads 161 may be in contact with the plurality of second bonding pads 162, respectively. By bonding the plurality of first bonding pads 161 with the plurality of second bonding pads 162, the first structure S1-3 and the second structure S2-3 may be electrically and mechanically connected to each other.

Figure 5:
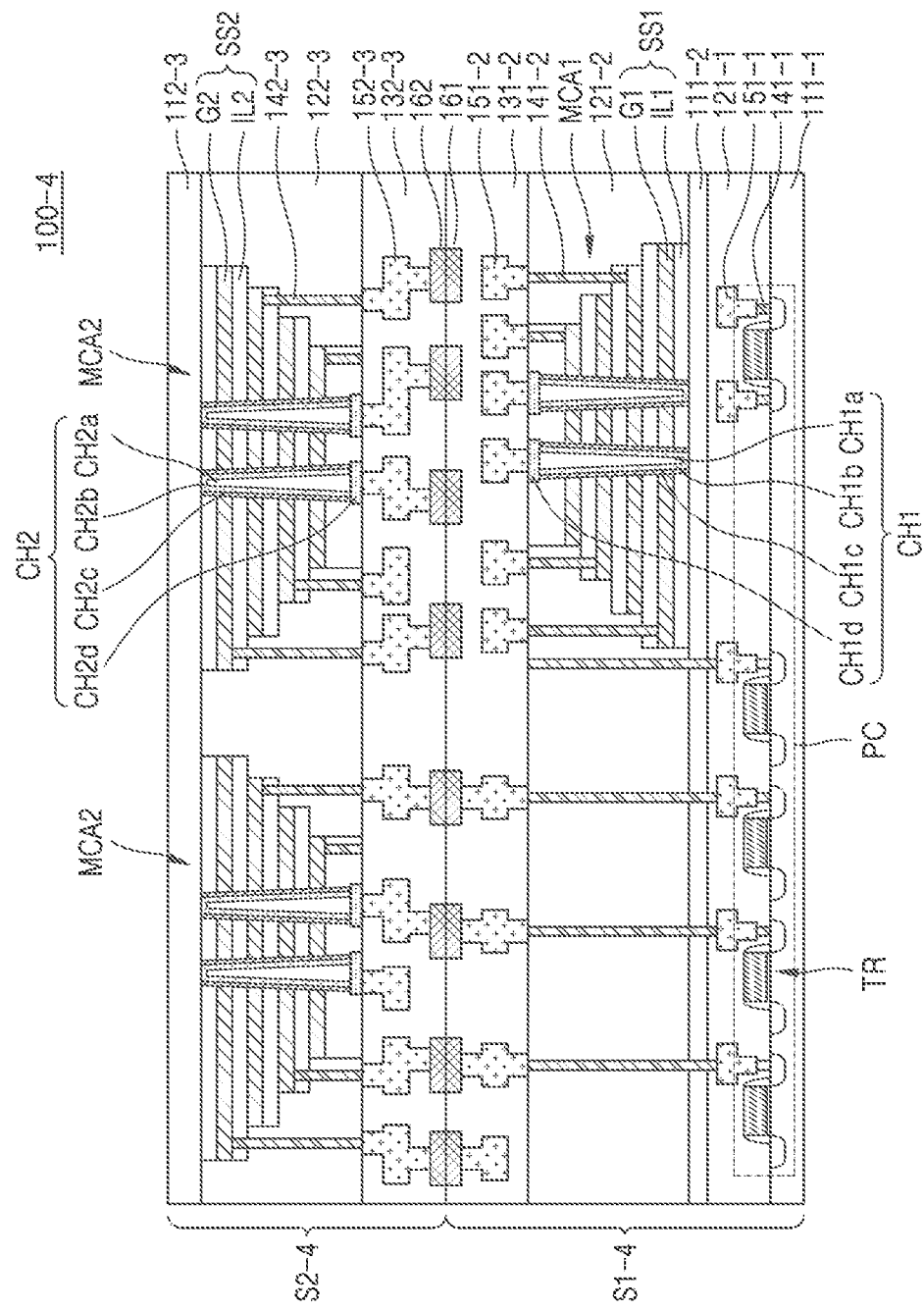
FIG. 5 is a cross-sectional view illustrating a memory device according to an embodiment of the inventive concept.

FIG. 5 is a cross-sectional view illustrating a memory device 100-4 according to an embodiment of the inventive concept. Hereinafter, differences between the memory device 100-3 shown in FIG. 4 and the memory device 100-4 shown in FIG. 5 are described.

Referring to FIG. 5, the memory device 100-4 may include a first structure S1-4 and a second structure S2-4.

The first structure S1-4 may include the first substrate 111-1, the peripheral circuit PC, the first insulating layer 121-1, the second substrate 111-2, at least one auxiliary memory cell array MCA1, the second insulating layer 121-2, and the plurality of first bonding pads 161. The first structure S1-4 may further include the plurality of first contacts 141-1, the first interconnect structure 151-1, the third insulating layer 131-2, the second interconnect structure 151-2, and the plurality of second contacts 141-2.

The second structure S2-4 may include the third substrate 112-3, a plurality of main memory cell arrays MCA2, the fourth insulating layer 122-3, and the plurality of second bonding pads 162. The second structure S2-4 may further include the fifth insulating layer 132-3, the third interconnect structure 152-3, and the plurality of third contacts 142-3.

The number of auxiliary memory cell arrays MCA1 may be fewer than the number of main memory cell arrays MCA2. Although FIG. 5 shows that the first structure S1-4 includes one auxiliary memory cell array MCA1 and the second structure S2-4 includes two main memory cell arrays MCA2, the number of auxiliary memory cell arrays MCA1 included in the first structure S1-4 and the number of main memory cell arrays MCA2 included in the second structure S2-4 are not limited thereto.

In some embodiments, a planar area of each auxiliary memory cell array MCA1 perpendicular to the vertical direction (Z direction) may be equal to a planar area of each main memory cell array MCA2 perpendicular to the vertical direction (Z direction). In some embodiments, a volume of each auxiliary memory cell array MCA1 may be equal to a volume of each main memory cell array MCA2. In some embodiments, the number of memory cells in each auxiliary memory cell array MCA1 may be equal to the number of memory cells in each main memory cell array MCA2. In some embodiments, the number of first gate layers G1 in each auxiliary memory cell array MCA1 may be equal to the number of second gate layers G2 in each main memory cell array MCA2.

Figure 6:
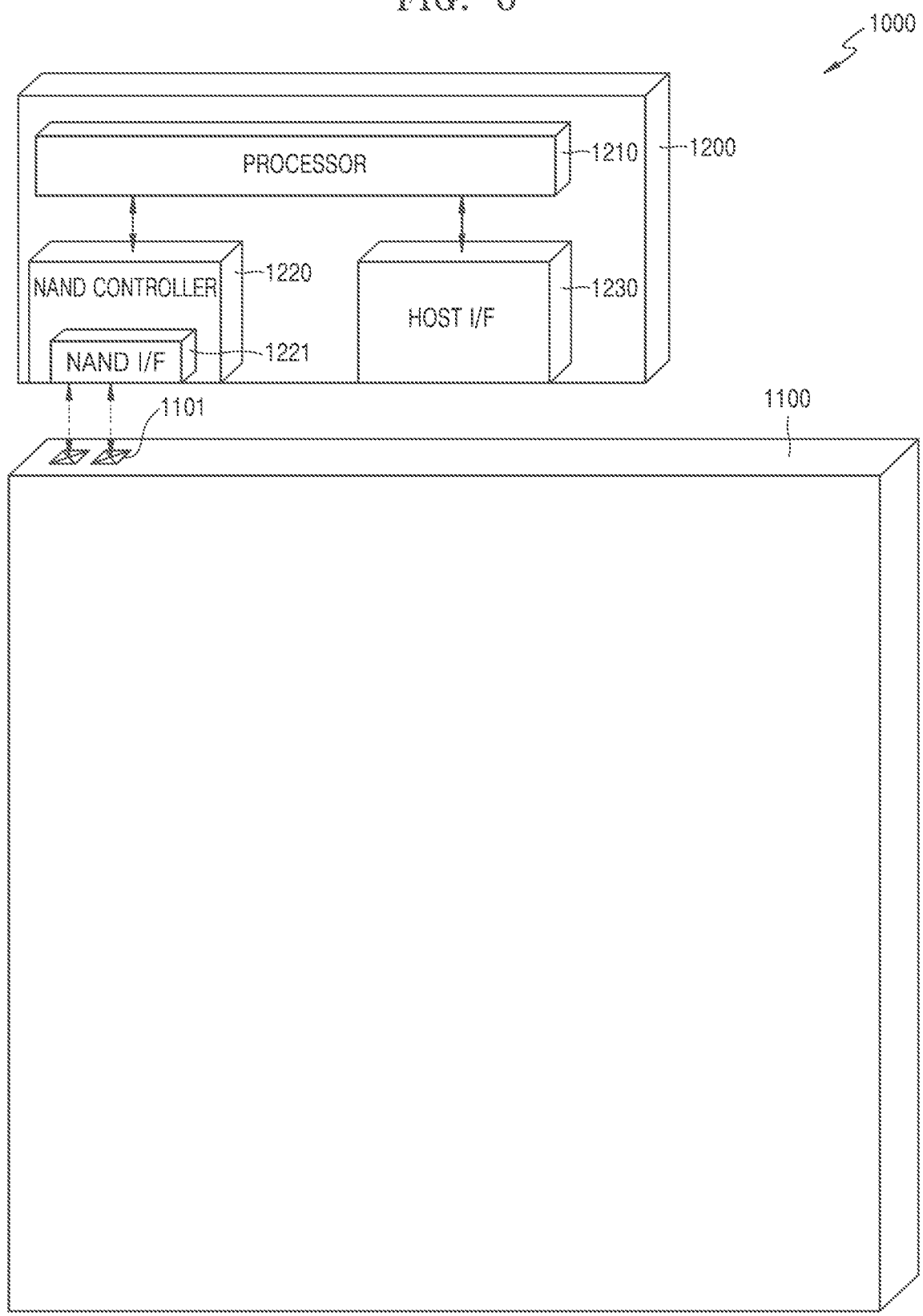
FIG. 6 is a block diagram of an electronic system including a memory device, according to an embodiment of the inventive concept.

FIG. 6 is a block diagram of an electronic system 1000 including a memory device 1100, according to an embodiment of the inventive concept.

Referring to FIG. 6, the electronic system 1000 according to embodiments of the inventive concept may include the memory device 1100 and a controller 1200 connected to the memory device 1100. The electronic system 1000 may be a storage device including one or more memory devices 1100, or an electronic device including a storage device. For example, the electronic system 1000 may be a solid state drive (SSD) device, a universal serial bus (USB) device, a computing system, a medical device, or a communication device including at least one memory device 1100.

The memory device 1100 may be a three-dimensional NAND flash memory device. For example, the memory device 1100 may include at least one of the memory devices 100, 100-1, 100-2, 100-3, and 100-4 shown in FIGS. 1 to 5. The memory device 1100 may communicate with the controller 1200 through input-output pads 1101 electrically connected to a control logic in the peripheral circuit PC (see FIGS. 1 to 5).

The controller 1200 may include a processor 1210, a NAND controller 1220, and a host interface 1230. According to embodiments, the electronic system 1000 may include a plurality of memory devices 1100, and in this case, the controller 1200 may control the plurality of memory devices 1100.

The processor 1210 may control a general operation of the electronic system 1000 including the controller 1200. The processor 1210 may operate according to certain firmware and control the NAND controller 1220 to access the memory device 1100. The NAND controller 1220 may include a NAND interface 1221 configured to process communication with the memory device 1100. Through the NAND interface 1221, a control command for controlling the memory device 1100, data to be written in the memory device 1100, data read from the memory device 1100, and the like may be transferred. The host interface 1230 may provide a communication function between the electronic system 1000 and an external host. When a control command is received from the external host through the host interface 1230, the processor 1210 may control the memory device 1100 in response to the control command.

Figure 7:
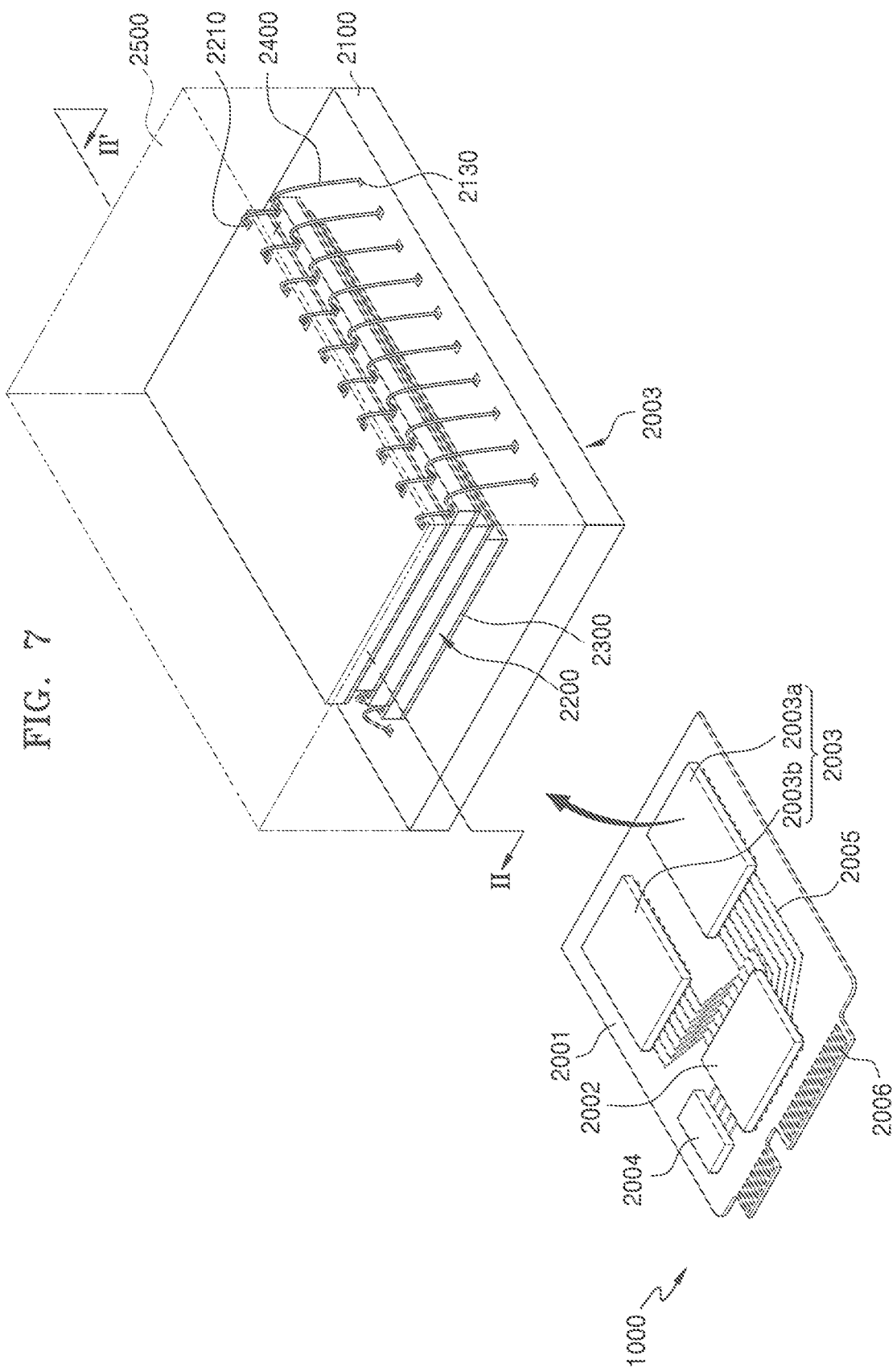
FIG. 7 is a perspective view of an electronic system including a memory device, according to an embodiment of the inventive concept.

FIG. 7 is a perspective view of the electronic system 1000 including a memory device, according to an embodiment of the inventive concept.

Referring to FIG. 7, the electronic system 1000 may include a main substrate 2001 and a controller 2002, a semiconductor package 2003, and dynamic random access memory (DRAM) 2004 on the main substrate 2001. The semiconductor package 2003 and the DRAM 2004 may be connected to the controller 2002 by a plurality of wiring patterns 2005 formed on the main substrate 2001.

The main substrate 2001 may include a connector 2006 including a plurality of pins coupled to an external host. The number of pins and the arrangement of the pins in the connector 2006 may vary according to a communication interface between the electronic system 1000 and the external host. In example embodiments, the electronic system 1000 may communicate with the external host according to any one of interfaces such as a USB interface, a peripheral component interconnect express (PCI-Express) interface, a serial advanced technology attachment (SATA) interface, and an M-Phy interface for a universal flash storage (UFS). In example embodiments, the electronic system 1000 may operate by power received from the external host through the connector 2006. The electronic system 1000 may further include a power management integrated circuit (PMIC) configured to distribute the power received from the external host to the controller 2002 and the semiconductor package 2003.

The controller 2002 may write or read data in or from the semiconductor package 2003 and improve an operating speed of the electronic system 1000.

The DRAM 2004 may be a buffer memory configured to mitigate a speed difference between the semiconductor package 2003, which is a data storage space, and the external host. The DRAM 2004 included in the electronic system 1000 may operate as a kind of cache memory and provide a space in which data is temporarily stored in a control operation performed on the semiconductor package 2003. When the DRAM 2004 is included in the electronic system 1000, the controller 2002 may further include a DRAM controller configured to control the DRAM 2004 in addition to a NAND controller configured to control the semiconductor package 2003.

The semiconductor package 2003 may include first and second semiconductor packages 2003a and 2003b separated from each other. Each of the first and second semiconductor packages 2003a and 2003b may include a plurality of semiconductor chips 2200. Each of the first and second semiconductor packages 2003a and 2003b may include a package substrate 2100, the plurality of semiconductor chips 2200 on the package substrate 2100, an adhesive layer 2300 beneath each of the plurality of semiconductor chips 2200, a plurality of connection structures 2400 electrically connecting the plurality of semiconductor chips 2200 to the package substrate 2100, and a molding layer 2500 covering the plurality of semiconductor chips 2200 and the plurality of connection structures 2400 on the package substrate 2100.

The package substrate 2100 may be a printed circuit board including a plurality of package upper pads 2130. Each of the plurality of semiconductor chips 2200 may include input-output pads 2210. The input-output pads 2210 may correspond to the input-output pads 1101 of FIG. 6. Each of the plurality of semiconductor chips 2200 may include at least one of the memory devices 100, 100-1, 100-2, 100-3, and 100-4 shown in FIGS. 1 to 5.

In example embodiments, the plurality of connection structures 2400 may be bonding wires electrically connecting the input-output pads 2210 to the plurality of package upper pads 2130. Therefore, in the first and second semiconductor packages 2003a and 2003b, the plurality of semiconductor chips 2200 may be electrically connected to each other by a bonding wire scheme and electrically connected to the plurality of package upper pads 2130 of the package substrate 2100. According to embodiments, in the first and second semiconductor packages 2003a and 2003b, the plurality of semiconductor chips 2200 may be electrically connected to each other through a connection structure including through silicon vias (TSVs) instead of the plurality of connection structures 2400 of the bonding wire scheme.

In example embodiments, the controller 2002 and the plurality of semiconductor chips 2200 may be included in one package. In example embodiments, the controller 2002 and the plurality of semiconductor chips 2200 may be mounted on a separate interposer substrate other than the main substrate 2001, and the controller 2002 and the plurality of semiconductor chips 2200 may be connected to each other through wirings formed on the interposer substrate.

Figure 8:
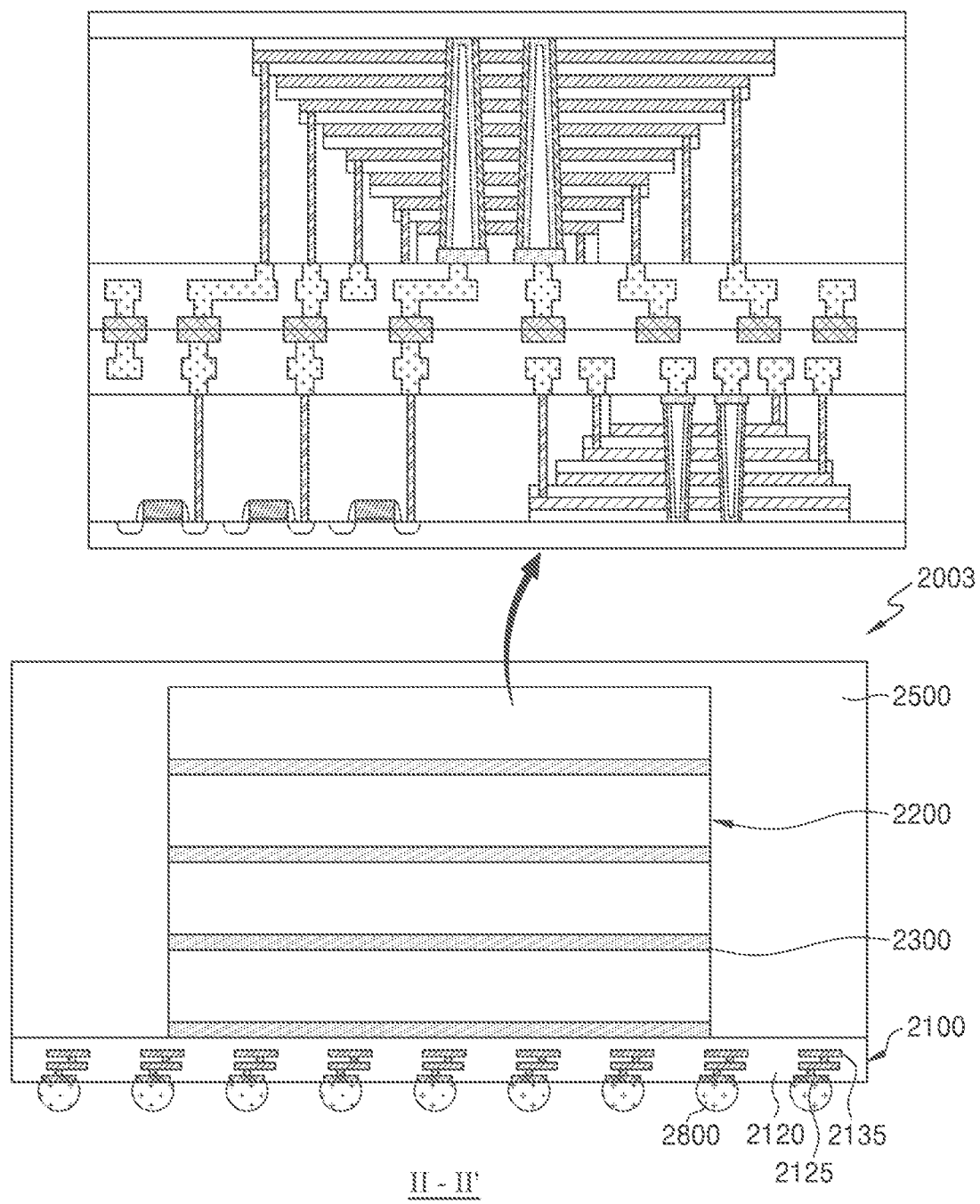
FIG. 8 is a cross-sectional view of a semiconductor package including a memory device, according to an embodiment of the inventive concept, taken along line II-IF of FIG. 7.

FIG. 8 is a cross-sectional view of the semiconductor package 2003 including a memory device, according to an embodiment of the inventive concept, taken along line of FIG. 7.

Referring to FIG. 8, in the semiconductor package 2003, the package substrate 2100 may be a printed circuit board. The package substrate 2100 may include a package substrate body part 2120, the plurality of package upper pads 2130 (see FIG. 7) on an upper surface of the package substrate body part 2120, a plurality of lower pads 2125 arranged on or exposed through a lower surface of the package substrate body part 2120, and a plurality of internal wirings 2135 inside the package substrate body part 2120 to electrically connect the plurality of package upper pads 2130 to the plurality of lower pads 2125. The plurality of lower pads 2125 may be connected, through a plurality of conductive connection parts 2800, to the plurality of wiring patterns 2005 on the main substrate 2001 of the electronic system 1000 shown in FIG. 7. Each of the plurality of semiconductor chips 2200 may include at least one of the memory devices 100, 100-1, 100-2, 100-3, and 100-4 shown in FIGS. 1 to 5.

While the inventive concept has been particularly shown and described with reference to embodiments thereof, it will be understood that various changes in form and details may be made therein without departing from the scope of the following claims.

What is claimed is:

1. A memory device comprising:
a first structure and a second structure stacked on the first structure in a vertical direction,
wherein the first structure comprises:
a first substrate;
peripheral circuitry on the first substrate;
an auxiliary memory cell array on the first substrate;
a first insulating layer on the first substrate, the peripheral circuitry, and the auxiliary memory cell array; and
a plurality of first bonding pads on the first insulating layer and electrically connected to the peripheral circuitry, and
the second structure comprises:
a second substrate;
a main memory cell array on the second substrate;
a second insulating layer on the second substrate and the main memory cell array; and
a plurality of second bonding pads on the second insulating layer and electrically connected to the main memory cell array,
wherein the plurality of first bonding pads are in contact with the plurality of second bonding pads, respectively, and
wherein one or more dimensions of the auxiliary memory cell array are smaller than those of the main memory cell array.

2. The memory device of claim 1, wherein a planar area of the auxiliary memory cell array perpendicular to the vertical direction is less than a planar area of the main memory cell array perpendicular to the vertical direction.

3. The memory device of claim 1, wherein a volume of the auxiliary memory cell array is less than a volume of the main memory cell array.

4. The memory device of claim 1, wherein:
the auxiliary memory cell array comprises a first stack structure on the first substrate and a plurality of first channel structures extending through the first stack structure in the vertical direction, the first stack structure comprising first interlayer insulating layers and first gate layers alternately stacked with each other on the first substrate; and
the main memory cell array comprises a second stack structure on the second substrate and a plurality of second channel structures extending through the second stack structure in the vertical direction, the second stack structure comprising second interlayer insulating layers and second gate layers alternately stacked with each other on the second substrate.

5. The memory device of claim 4, wherein a number of the first gate layers in the first stack structure is fewer than a number of the second gate layers in the second stack structure.

6. The memory device of claim 1, wherein the auxiliary memory cell array is configured to provide additional storage capacity in addition to a storage capacity of the main memory cell array.

7. The memory device of claim 1, wherein the auxiliary memory cell array is configured to repair the main memory cell array.

8. A memory device comprising:
a first structure and a second structure stacked on the first structure in a vertical direction,
wherein the first structure comprises:
a first substrate;
peripheral circuitry on the first substrate;
at least one auxiliary memory cell array on the first substrate;
a first insulating layer on the first substrate, the peripheral circuitry, and the at least one auxiliary memory cell array; and
a plurality of first bonding pads on the first insulating layer and electrically connected to the peripheral circuitry, and
the second structure comprises:
a second substrate;
a plurality of main memory cell arrays on the second substrate;
a second insulating layer on the second substrate and the plurality of main memory cell arrays; and
a plurality of second bonding pads on the second insulating layer and electrically connected to the plurality of main memory cell arrays, wherein
the plurality of first bonding pads are in contact with the plurality of second bonding pads, respectively, and
a number of the at least one auxiliary memory cell array is fewer than a number of the main memory cell arrays.

9. The memory device of claim 8, wherein a planar area of each of the at least one auxiliary memory cell array perpendicular to the vertical direction is equal to a planar area of each of the plurality of main memory cell arrays perpendicular to the vertical direction.

10. The memory device of claim 8, wherein a planar area of each of the at least one auxiliary memory cell array perpendicular to the vertical direction is less than a planar area of each of the plurality of main memory cell arrays perpendicular to the vertical direction.

11. The memory device of claim 8, wherein a number of memory cells in each of the at least one auxiliary memory cell array is fewer than or equal to a number of memory cells in each of the plurality of main memory cell arrays.

12. The memory device of claim 8, wherein the at least one auxiliary memory cell array is laterally adjacent the peripheral circuitry on the first substrate.

13. The memory device of claim 8, wherein:
- each of the at least one auxiliary memory cell array comprises a first stack structure on the first substrate and a plurality of first channel structures extending through the first stack structure in the vertical direction, the first stack structure comprising first interlayer insulating layers and first gate layers alternately stacked with each other on the first substrate; and
- each of the plurality of main memory cell arrays comprises a second stack structure on the second substrate and a plurality of second channel structures extending through the second stack structure in the vertical direction, the second stack structure comprising second interlayer insulating layers and second gate layers alternately stacked with each other on the second substrate.

14. The memory device of claim 13, wherein a number of the first gate layers in the first stack structure is equal to a number of the second gate layers in the second stack structure.

15. The memory device of claim 13, wherein a number of the first gate layers in the first stack structure is fewer than a number of the second gate layers in the second stack structure.

16. The memory device of claim 8, wherein the at least one auxiliary memory cell array is configured to provide additional storage capacity in addition to a storage capacity of the plurality of main memory cell arrays.

17. The memory device of claim 8, wherein the at least one auxiliary memory cell array is configured to repair the plurality of main memory cell arrays.

18. A memory device comprising:
- a first structure and a second structure stacked on the first structure in a vertical direction,
  - wherein the first structure comprises:
  - a first substrate;
  - peripheral circuitry on the first substrate;
  - a first insulating layer on the first substrate and the peripheral circuitry;
  - a second substrate on the first insulating layer;
  - an auxiliary memory cell array on the second substrate;
  - a second insulating layer on the second substrate and the auxiliary memory cell array; and
  - a plurality of first bonding pads on the second insulating layer and electrically connected to the peripheral circuitry, and
  - the second structure comprises:
  - a third substrate;
  - a main memory cell array on the third substrate;
  - a third insulating layer on the third substrate and the main memory cell array; and
  - a plurality of second bonding pads on the third insulating layer and electrically connected to the main memory cell array,
  - wherein the plurality of first bonding pads are in contact with the plurality of second bonding pads, respectively, and
  - wherein one or more dimensions of the auxiliary memory cell array are smaller than those of the main memory cell array.

19. The memory device of claim 18, wherein a volume of the auxiliary memory cell array is less than a volume of the main memory cell array.

20. The memory device of claim 18, wherein:
- the auxiliary memory cell array comprises a first stack structure on the second substrate and a plurality of first channel structures extending through the first stack structure in the vertical direction, the first stack structure comprising first interlayer insulating layers and first gate layers alternately stacked with each other on the second substrate,
- the main memory cell array comprises a second stack structure on the third substrate and a plurality of second channel structures extending through the second stack structure in the vertical direction, the second stack structure comprising second interlayer insulating layers and second gate layers alternately stacked with each other on the third substrate, and
- a number of the first gate layers in the first stack structure is less than a number of the second gate layers in the second stack structure.

* * * * *